United States Patent
Thapa et al.

(10) Patent No.: US 9,147,726 B2
(45) Date of Patent: Sep. 29, 2015

(54) SEMICONDUCTOR WAFER WITH A LAYER OF $AL_zGA_{1-z}N$ AND PROCESS FOR PRODUCING IT

(71) Applicant: Siltronic AG, Munich (DE)

(72) Inventors: Sarad Bahadur Thapa, Burghausen (DE); Thomas Schroeder, Berlin (DE); Lidia Tarnawska, Wroclaw (PL)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 14/197,296

(22) Filed: Mar. 5, 2014

(65) Prior Publication Data

US 2014/0264776 A1 Sep. 18, 2014

(30) Foreign Application Priority Data

Mar. 12, 2013 (EP) .................................... 13158844

(51) Int. Cl.
*H01L 29/04* (2006.01)
*H01L 21/02* (2006.01)

(52) U.S. Cl.
CPC .......... *H01L 29/045* (2013.01); *H01L 21/0254* (2013.01); *H01L 21/02381* (2013.01); *H01L 21/02433* (2013.01); *H01L 21/02488* (2013.01); *H01L 21/02502* (2013.01); *H01L 21/02516* (2013.01); *H01L 21/02609* (2013.01)

(58) Field of Classification Search
CPC ................... H01L 21/02381; H01L 21/02488; H01L 21/0254; H01L 21/02502; H01L 21/02433; H01L 21/02609; H01L 29/045; H01L 2924/01021

USPC .......................................................... 257/627
See application file for complete search history.

(56) References Cited

U.S. PATENT DOCUMENTS 7,020,374 B2 * 3/2006 Talin et al. .................... 385/131
2012/0061683 A1 3/2012 Toba et al.

FOREIGN PATENT DOCUMENTS

EP 1975988 A1 10/2008
KR 10-2011-0130502 12/2011

OTHER PUBLICATIONS

W.C. Lee et al.; GaN on Si with nm-thick single-crystal Sc2O3 as a template using molecular beam epitaxy; Journal of Crystal Growth 311 (2009); pp. 2006-2009; Elsevier B.V.
M.A. Moram et al.; Growth of dislocation-free GaN islands on Si (111) using a scandium nitride buffer layer; Journal of Crystal Growth 308 (2007); pp. 302-308; published online Sep. 15, 2007;Elsevier B.V.

(Continued)

*Primary Examiner* — Brook Kebede
(74) *Attorney, Agent, or Firm* — Brooks Kushman P.C.

(57) ABSTRACT

A semiconductor wafer contains the following layers in the given order:
  a monocrystalline substrate wafer (1) consisting predominantly of silicon and having a (111) surface orientation,
  a monocrystalline layer (3) of $Sc_2O_3$ having a (111) surface orientation,
  a monocrystalline layer (4) of ScN having a (111) surface orientation, and
  a monocrystalline layer (6) of $Al_zGa_{1-z}N$ with $0 \le z \le 1$ having a (0001) surface orientation,
the semiconductor wafers are produced by appropriate deposition of the respective layers.

20 Claims, 2 Drawing Sheets

(56) References Cited

OTHER PUBLICATIONS

L. Tarnawska et al.; Structural and optical of GaN grown on Sc2O3/Y2O3/Si (111); Journal of Applied Physics 111, 073509 (2012); pp. 1-4; American Institute of Physics; published online Apr. 4, 2012.

D. Zengler et al.; (HR) TEM-investigations of GaN/Sc2O3/Y2O3/Si (111) heterostructure; pp. 1-2; Journal of Applied Physics 108 (2010).

Morito Akiyama et al.; Influence of growth temperature and scandium concentration on piezoelectric response of scandium aluminum nitride alloy thin films; Applied Physics Letters 95, 162107 (2009); pp. 1-3, published online Oct. 21, 2009.

M.E. Little et al.; Band-gap engineering in sputter-deposited $Sc_xGa_{1-x}N$; Applied Physics Letters; vol. 78, No. 19; pp. 1-2; published May 7, 2001; American Institute of Physics.

Costel Constantin et al.; ScGaN alloy growth by molecular beam epitaxy: Evidence for a metastable layered hexagonal phase; Physical Review B 70, 193309; published Nov. 23, 2004; The American Physical Society.

* cited by examiner

SEMICONDUCTOR WAFER WITH A LAYER OF $Al_zGa_{1-z}N$ AND PROCESS FOR PRODUCING IT

CROSS-REFERENCE TO RELATED APPLICATIONS

This application claims priority to European Patent Application No. EP 13158844 filed Mar. 12, 2013 which is herein incorporated by reference.

BACKGROUND OF THE INVENTION

1. Field of the Invention

The present invention relates to a semiconductor wafer comprising a monocrystalline substrate wafer consisting essentially of silicon which has a (111) surface orientation and a monocrystalline layer of $Al_zGa_{1-z}N$ with $0 \leq z \leq 1$ having a (0001) surface orientation.

2. Description of the Related Art

Monocrystalline gallium nitride (GaN) is of increasing importance as a substrate for producing light emitting diodes (LEDs) and field effect transistors (FETs) for high power and high frequency applications. The surface area of the substrate is a key issue for the productivity of the manufacturing process and therefore for the cost of an LED or FET. As monocrystalline silicon substrates with diameters of up to 300 mm or even up to 450 mm are currently available with high crystal and surface quality, efforts are being made to use monocrystalline silicon as a substrate for the epitaxial growth of GaN. However, due to the large lattice mismatch of 17% between GaN(0001) and Si(111) and the large difference in the thermal expansion coefficients (TEC) of the two materials, high quality GaN layers cannot be grown directly on silicon (Si).

For this reason, many types of intermediate or buffer layers have been proposed in order to increase the quality of the epitaxially grown GaN layer.

For example, M. Moram et al., J. CRYSTAL GROWTH 308 (2007), 302-308 teach the use of an epitaxial (111) oriented scandium nitride (ScN) buffer layer as a basis for GaN epitaxy. The ScN layers with a thickness ranging from 50 to 450 nm were grown on n-type Si(111) wafers using gas-source molecular beam epitaxy (GS-MBE) with ammonia as the nitrogen precursor. GaN layers were grown on the ScN/Si (111) templates using a Thomas Swan close-coupled showerhead MOVPE reactor operating at 100 Torr. In preparation for GaN growth, each template used was heated to the growth temperature at a rate of 1 K/s under a flow of 10 slm (standard liter per minute) ammonia ($NH_3$) and 10 slm hydrogen ($H_2$) in order to remove any native oxide from the surface of the ScN layers. The ScN buffer layer was rough and full of defects. The GaN grew on the ScN surface in the form of dislocation-free islands. By varying the GaN growth temperature, the GaN islands could be caused to coalesce in order to yield a smooth GaN film, but at the same time the density of threading dislocations on the surface of the GaN layer increased considerably up to $5 \times 10^9$ $cm^{-2}$.

W. C. Lee et al., J. CRYSTAL GROWTH 311 (2009), 2006-2009 disclose single-crystalline scandium oxide ($Sc_2O_3$) as a template for GaN epitaxy. $Sc_2O_3$ films were deposited using e-beam evaporation from a high-purity powder-packed-sintered $Sc_2O_3$ oxide source. A few monolayers of aluminium (Al) were deposited on the $Sc_2O_3$ surface using molecular beam epitaxy (MBE), followed by the exposure to nitrogen plasma for nitridation in order to form a thin aluminium nitride (AlN) layer. GaN was deposited on top of this layer. The substrate temperature for growing AlN was at about 645° C. in the beginning and was raised to 720° C., which was also used for the rest of the GaN growth. The method results in a high defect density in the $Sc_2O_3$ buffer and a limited GaN layer quality. Dislocations occurred in a density in the range of $10^{10}$ $cm^{-3}$. The dislocations propagated throughout the layer starting from the $Sc_2O_3$/Si interface.

SUMMARY OF THE INVENTION

It is therefore an object of the invention to provide a GaN layer with a reduced defect density grown on a silicon substrate. These and other objects are achieved by providing a semiconductor wafer comprising the following layers in the given order:

a monocrystalline substrate wafer consisting essentially of silicon and having a (111) surface orientation, a monocrystalline layer of $Sc_2O_3$ having a (111) surface orientation, a monocrystalline layer of ScN having a (111) surface orientation, and a monocrystalline layer of $Al_zGa_{1-z}N$ with $0 \leq z \leq 1$ having a (0001) surface orientation.

The invention also relates to a process for the production of such a semiconductor wafer, comprising the following steps in the given order:

a) providing the substrate wafer,
c) epitaxially depositing the $Sc_2O_3$ layer,
d) producing the ScN layer, and
f) epitaxially depositing the $Al_zGa_{1-z}N$ layer.

DETAILED DESCRIPTION OF THE PREFERRED EMBODIMENT(S)

Figure 1:
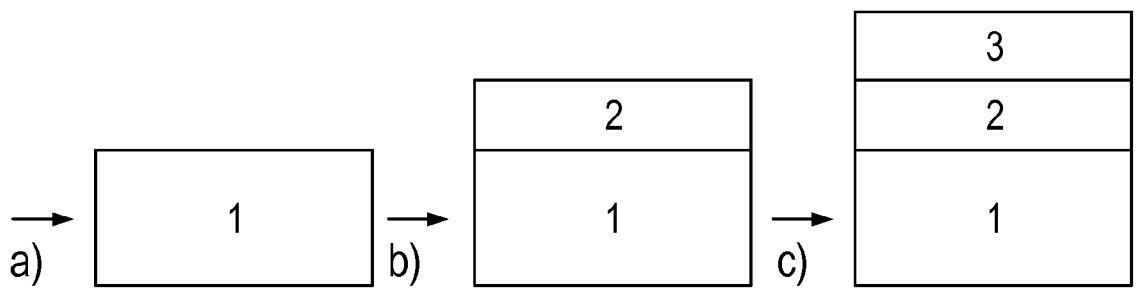
FIG. 1 schematically illustrates an embodiment of the present invention.
Figure 1:
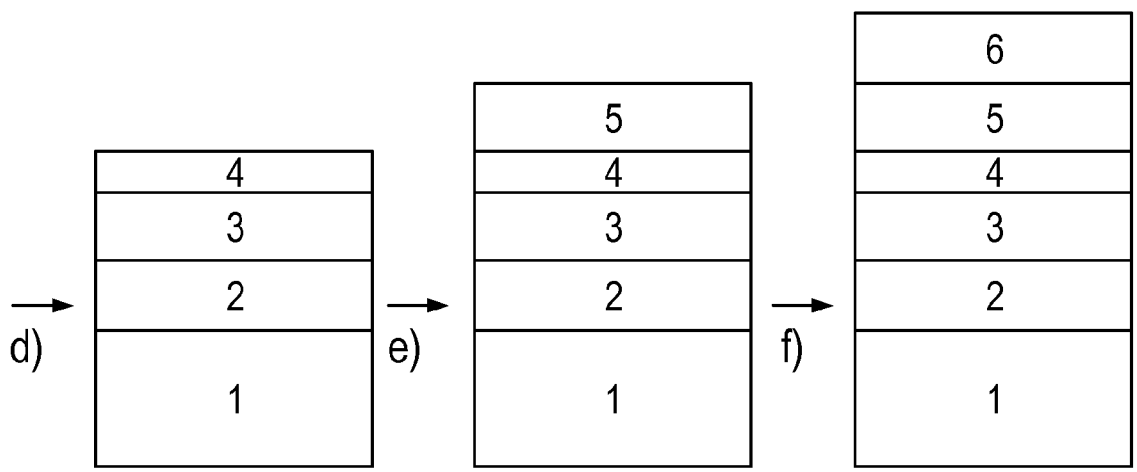

As mentioned above, $Sc_2O_3$ buffer layers have already been known for the subsequent deposition of GaN. According to the bulk crystal lattices, an $Sc_2O_3$ buffer layer theoretically allows to reduce the lattice misfit between GaN and the substrate from 17% (GaN/Si) to 8% (GaN/$Sc_2O_3$). However, the remaining lattice mismatch still leads to the generation of a high density of defects (mainly dislocations) in the GaN layer and therefore limits the quality of this layer.

The inventors thus found that it is necessary to insert another intermediate layer that can be grown with good crystal quality on the $Sc_2O_3$ and whose lattice constant is closer to GaN. ScN(111) is such a layer. The lattice mismatch between ScN(111) and GaN(0001) is only about −0.1%. It was found that Sc is the only metal whose oxide can firstly be grown directly on Si in form of an epitaxial layer and secondly be converted into a nitride having a lattice constant perfectly matching to the lattice constant of GaN. The extremely small lattice mismatch between ScN and GaN favours a layer-by-layer growth of GaN on the ScN surface, reducing the density of defects which occur due to island coalescence. Furthermore, the nitridation step of the $Sc_2O_3$ surface allows for control of the polarity of the growing $Al_zGa_{1-z}N(0001)$ layer and improves the thermal budget of the heterostructure for subsequent high temperature processing steps.

Furthermore, GaN grows under tensile strain on top of the larger $Sc_2O_3$ lattice. The in-plane lattice constant a of GaN at growth temperature is larger than the relaxed bulk value, and this strain increases further during cooling down to room temperature due to different values of the thermal expansion coefficients. By inserting the additional ScN intermediate layer, lattice-induced tensile strain during growth is reduced, which improves the strain situation of the GaN layer at room temperature. The ScN layer can be relaxed or strained depending upon the layer thickness. However, a relaxed ScN is preferable for GaN deposition. A strained ScN layer can further relax during the epitaxial deposition of the next layer.

Due to an extremely large lattice mismatch between Si and ScN, a ScN layer deposited directly on the silicon substrate (as disclosed by M. Moram et al., J. Crystal Growth 308 (2007), 302-308) is rough and full of defects. Si needs to be protected from Ga and $NH_3$ during the growth of GaN because the Ga etches the Si surface. A poor quality ScN layer on a silicon substrate may not fully cover the silicon, such that the silicon may be exposed to the Ga and $NH_3$ during the growth of the GaN top layer. The crystallinity of the ScN buffer layer was shown to affect the morphology, residual strain and crystallinity of the subsequently grown GaN.

In the stack of layers according to the present invention, the lattice misfit of ScN on $Sc_2O_3$ is reduced compared to that of ScN on Si. Therefore, the crystal quality of ScN is improved and the above-described effects of a poor quality ScN layer do not occur. A GaN layer with high quality can finally be grown on the ScN layer according to the invention.

In the first step a) (cf. FIG. 1), a monocrystalline substrate wafer 1 is provided, which consists essentially of monocrystalline silicon, preferably it contains 90% to 100% silicon, more preferably of 98% to 100% silicon. The substrate wafer 1 may comprise the usual dopants or impurities generally known in the field of silicon technology and has a crystal surface orientation of Si(111). The substrate wafer 1 may have a diameter of 100 mm to 450 mm; a diameter of not more than 300 mm is preferable. The surface of the substrate wafer is preferably polished.

Preferably, the substrate wafer 1 is annealed at high temperature to obtain a high quality silicon surface. This anneal is preferably performed in situ in the deposition chamber which is used for the deposition of the first epitaxial layer. The anneal temperature is between 600 and 1250° C. The anneal may be performed in a vacuum or under a reducing atmosphere, preferably comprising hydrogen, for 30 seconds to 30 minutes, preferably from one to ten minutes.

In a subsequent optional step b), a monocrystalline metal oxide layer 2 may be epitaxially deposited on at least one surface of the substrate wafer 1. The metal oxide may have spinell, perovskite, pyrochlore, rock salt, fluorite or bixbyite structure.

It is preferable to deposit the metal oxide layer 2 on the surface of the substrate wafer 1 prior to the deposition of the $Sc_2O_3$ layer 3 in step c) because the lattice misfit of about 9% between $Sc_2O_3$ and Si can be reduced by an intermediate layer with a lattice constant between the lattice constants of $Sc_2O_3$ and Si. This reduces the defect density in the $Sc_2O_3$ layer 3 and therefore increases the quality of the layer 6 of $Al_zGa_{1-z}N$.

Chemical vapour deposition (CVD), molecular-beam epitaxy (MBE), pulsed-laser deposition (PLD) or sputtering techniques known in the prior art can be used to deposit the metal oxide layer 2 on Si. In case of MBE, the deposition is preferably performed at a temperature of 400 to 800° C. at a rate of 0.1 to 10 nm/min. Optionally, oxygen may be present at a pressure of $10^{-4}$ to $10^{-1}$ Pa.

The metal oxide layer 2 may have a composition of $(M^1_w M^2_{1-w})_2 O_3$ with $0 \leq w \leq 1$ and a (111) lattice orientation. $M^1$ is a first metal and $M^2$ is a second metal. Preferably, metals are selected whose $M_2O_3$ oxides exist in the cubic Ia-3 structure. This structure fits to the structure of the Si(111) surface and is identical to the structure of the following layer 3 of $Sc_2O_3$. $M^1$, $M^2$ and w are selected such that the lattice constant of the metal oxide layer 2 is equal to or smaller than the lattice constant of the substrate wafer 1 and equal to or larger than the lattice constant of the layer 3 of $Sc_2O_3$.

In one embodiment, w starts with a value w1 at the boundary to the substrate wafer 1, varies across the thickness of the metal oxide layer 2 in order to achieve a variation in the lattice constant of the material of the metal oxide layer 2 across its thickness, and ends with a value w2 at the boundary to the layer 3 of $Sc_2O_3$. In this embodiment, the value w1 is preferably selected such that the in-plane lattice constants of the substrate wafer 1 and the metal oxide layer 2 differ by 0% to 4% (and preferably by 0 to 2%) at the boundary between the substrate wafer 1 and the metal oxide layer 2. The value w2 is preferably selected such that the in-plane lattice constants of the metal oxide layer 2 and the layer 3 of $Sc_2O_3$ to be deposited in subsequent step c) differ by 0% to 4% (and preferably by 0 to 2%) at the boundary between the said layers. Preferably, w is varied in a stepwise manner, i.e. w is kept constant for a certain thickness, then w is abruptly changed and again kept constant for a certain thickness. The metal oxide layer 2 may comprise a suitable number of such steps in order to allow lattice relaxation within the constant w portions of the layer and defect annihilation at the interfaces where w is abruptly varied. In case of a step-graded layer, the individual sub-layers of constant composition preferably have a thickness of at least 10 nm. This is the minimum thickness that results in complete relaxation of the layer if the lattice mismatch is between 1% and 10%. In general, the total thickness of the metal oxide layer 2 should not exceed 100 nm.

The first metal $M^1$ may be yttrium (Y), the second metal $M^2$ may be scandium (Sc). The in-plane lattice constant of $Y_2O_3$ is about 2% smaller than that of Si(111). Therefore, it is preferable to start with pure $Y_2O_3$ (i.e. w=1) at the interface to the substrate wafer 1, to increase (preferably stepwise) the fraction of $Sc_2O_3$ with increasing thickness of the metal oxide layer 2, and to end with pure $Sc_2O_3$ (i.e. w=0) at the top of the layer. Other combinations and compositions may be selected in accordance with the teachings of EP1975988A1.

It is also possible to select w=1, i.e. the metal oxide layer 2 consists merely of a binary oxide, e.g. $Y_2O_3$. The thickness of such a layer typically ranges from 1 to 100 nm. It must on the one hand protect the Si substrate wafer 1 against being attacked by gallium during GaN overgrowth and provide on the other hand a flat surface for high quality $Sc_2O_3$ heterostructure deposition.

The insertion of the optional metal oxide layer 2 is advantageous because this way the lattice constant can be adjusted step-by-step from the substrate wafer 1 to the layer 6 of GaN. The lattice misfit between the layer 3 of $Sc_2O_3$ and the substrate wafer 1 is about −8%. The metal oxide layer 2 divides this relatively large misfit into smaller portions at at least two phase boundaries.

Next, a stack of oxide layers with different lattice constants (metal oxide layer 2 and the following layer 3 of $Sc_2O_3$) serves as an improved buffer against the strong chemical reaction between GaN and Si at high temperatures. In case of an $Sc_2O_3$ layer only, a high number of dislocations propagates to the interface to the subsequent layer of GaN or, generally, $Al_zGa_{1-z}N$. Gallium diffuses through the oxide layer predominantly along the dislocations and may reach the interface to the silicon substrate wafer 1. In case of a stack of several oxide layers, less dislocations form and the dislocations are annihilated in part at each phase boundary, reducing the number of dislocations reaching the surface of the layer of $Sc_2O_3$. This hampers the diffusion of gallium atoms through the oxide layer and protects the silicon interface from being attacked by gallium.

In subsequent step c), a monocrystalline layer 3 of $Sc_2O_3$ having a (111) surface orientation is epitaxially deposited either on at least one of the surfaces of the substrate wafer 1 or on the top surface of the metal oxide layer 2 in case step b) was performed. The thickness should be large enough to ensure that the layer is relaxed and entirely covers the underlying layer, but not unnecessarily large to avoid surface roughening due to kinetic growth effects. Therefore, the layer 3 of $Sc_2O_3$ has a thickness of at least 2 nm and not more than 500 nm, preferably not more than 200 nm.

CVD, MBE, PLD or sputtering techniques are used to deposit the layer 3 of $Sc_2O_3$. In case of MBE, a standard MBE source may be used. The deposition may take place at a temperature of 400 to 800° C. at a rate of 0.1 to 10 nm/min. Optionally, oxygen may be present at a pressure of $10^{-4}$ to $10^{-1}$ Pa.

In subsequent step d), a monocrystalline layer 4 of ScN having a (111) surface orientation is produced on the top surface of the layer 3 of $Sc_2O_3$. The effect of this layer has been described above. The layer preferably has a thickness of at least 2 and not more than 500 nm, more preferably not more than 200 nm. ScN(111) films on Si(111) tend to grow with columnar structure characteristics, resulting in pronounced surface roughening with increased thickness. In consequence, the smaller lattice mismatch between ScN and $Sc_2O_3$ with respect to ScN and Si allows to optimize the quality of the ScN layer as a function of layer thickness with respect to defects and roughness. In view of these observations, the thickness of the layer 4 of ScN should be in the range from 2 to 200 nm.

At the interface between the layer 3 of $Sc_2O_3$ and the layer 4 of ScN, a thin layer of scandium oxynitride may be formed, depending on the process conditions. This interlayer is not detrimental to the function of the ScN layer.

In a first embodiment of step d), the layer 4 of ScN is produced by converting the surface of the layer 3 of $Sc_2O_3$ into ScN by exposing the surface to an atmosphere comprising a nitrogen source at a temperature of 200 to 1200° C. This nitridation of the $Sc_2O_3$(111) surface provides a few nm thick ScN(111) layer 4. A thin layer is preferred because of the pronounced roughening tendency of the material. With this method, a single-crystalline layer having a thickness of 2 to 10 nm can be obtained.

The nitrogen source is either a nitrogen-containing gas, preferably $NH_3$ (diluted in an atmosphere of hydrogen ($H_2$) or nitrogen ($N_2$)), or a nitrogen-containing plasma. The plasma source may be selected from known plasma sources, e.g. an electron cyclotron resonance (ECR) or a radio-frequency (rf) plasma source.

The nitrogen-containing gas or plasma reacts with the surface of layer 3 of $Sc_2O_3$ and replaces oxygen (O) atoms partially or fully with nitrogen (N) atoms forming layer 4 of ScN. The thickness of the layer 4 of ScN depends upon the nitridation time, temperature, flows and partial pressure of the nitrogen gas or plasma sources. The residual strain or relaxation of the layer 4 of ScN depends upon the thickness of the layer.

Studies of $NH_3$ adsorption on various surfaces have observed that as temperature increases, the rate of $NH_3$ dehydrogenation increases, such that eventually only nitrogen atoms were left on the surface. On $Sc_2O_3$ at elevated temperature, most of the adsorbed $NH_3$ undergoes a complete dehydrogenation leaving only adsorbed nitrogen atoms on the surface. Some hydrogen atoms recombine and desorb from the surface as $H_2$ and some hydrogen atoms may combine with oxygen, which is diffusing out from the $Sc_2O_3$ surface and desorb as $H_2O$, Some of the adsorbed nitrogen atoms diffuse into the $Sc_2O_3$ and react with the network of scandium and oxygen atoms. The diffused nitrogen substitutes for oxygen to bond with scandium and form a thin layer of ScN.

In a second embodiment of step d), the layer 4 of ScN is produced by depositing a layer of scandium on the surface of the layer 3 of $Sc_2O_3$ and subsequently nitridating the scandium layer.

The deposition of the layer of Sc can be achieved by evaporation of thin layers of Sc metal in a nitrogen environment on the surface of the layer 3 of $Sc_2O_3$. Suitable processes are molecular beam epitaxy (MBE), metal-organic chemical vapour deposition (MOCVD) or sputtering techniques. Then, the Sc-covered template is subjected to a nitridation process as described in the first embodiment of step d) above, exposing the surface of the layer of scandium to an atmosphere comprising a nitrogen source at a temperature of 200 to 1200° C. These two steps can be repeated several times in order to obtain a ScN layer having the desired thickness.

In a third embodiment of step d), the layer 4 of ScN is produced by epitaxial deposition on the surface of the layer 3 of $Sc_2O_3$. An MBE technique using a scandium effusion cell, which is heated to a temperature of 1300 to 1450° C., and an ambient comprising $NH_3$ (preferably in the form of a plasma) may be used to deposit the ScN layer. The substrate temperature is preferably between 450 and 650° C.

The second and third embodiments are particularly preferred if a ScN film with a thickness exceeding 10 nm is desired, which cannot be produced by nitridation of the $Sc_2O_3$ surface.

The ScN layer 4 is preferably annealed in an ambient comprising $NH_3$ or $H_2$ or a mixture of $NH_3$ and $H_2$ during temperature ramping up for subsequent group-III nitride growth in steps e) or f). Annealing can help to fully relax the ScN layer, to decrease surface roughness and to cure out point defects. Depending on the atmosphere, surface termination for the growth of the next layer can be optimized. For example, $NH_3$ results in an N-terminated surface. Furthermore, if the next layer (in one of steps e) or f)) is grown at a higher temperature than the temperature of step d), it is preferable to anneal the layer 4 of ScN in an ambient comprising $NH_3$ to minimize nitrogen decomposition from ScN during temperature ramp up.

In a subsequent optional step e), a monocrystalline metal nitride layer 5 having a composition of $(Al_xGa_{1-x})_ySc_{1-y}N$ with $0 \leq x \leq 1$ and $0 < y < 1$ may be epitaxially deposited on the surface of the layer 4 of ScN. According to the theoretical study of K. Shimada et al., SEMICOND. SCI. TECHNOL. 27 (2012), 105014, the alloy of $(Al_xGa_{1-x})_ySc_{1-y}N$ crystallizes in hexagonal wurtzite structure and the arrangement of Sc and IIIA-V atoms in the unit cell depends upon the alloy compositions. This optional layer can be grown using sputtering (M. Akiyama et al, Appl. Phy. Lett. 95, 162107 (2009) and M. E. Little et al, Appl. Phy. Lett. 78, 2891 (2001)) or MBE (C. Constantin et al., Phys. Rev. B 70, 193309 (2004)) or MOCVD techniques. The actual values for x and y are selected in view of the purpose for which the layer is deposited.

Irrespective of the actual composition, a transition layer comprising a certain fraction of ScN promotes greater wetting of the surface by $Al_zGa_{1-z}N$, allowing full coalescence of the growing $Al_zGa_{1-z}N$ at an early stage of the growth.

In a first embodiment, the metal nitride layer 5 is compositionally graded to achieve a smooth transition from the layer 4 of ScN to the top layer 6 consisting of $Al_zGa_{1-z}N$. In this case, x and y start with values $x^1$ and $y^1$, respectively, at the boundary to the layer 4 of ScN, vary across the thickness of the metal nitride layer 5 in order to achieve a variation in the lattice constant of the material of the metal nitride layer 5 across its thickness, and end with values $x^2$ and $y^2$, respectively, at the boundary to the layer of $Al_zGa_{1-z}N$. Preferably, the values $x^1$ and $y^1$ are selected such that the lattice constants of the metal nitride layer 5 and the layer 4 of ScN differ by 0% to 1% at the boundary between the said layers. Preferably, the values $x^2$ and $y^2$ are selected such that the lattice constants of the metal nitride layer 5 and the layer 6 of $Al_zGa_{1-z}N$ differ by 0% to 1% at the boundary between the said layers. Most preferably, $y^2=1$ and $x^2$ corresponds to the composition of the layer 6 of $Al_zGa_{1-z}N$, which allows for perfect lattice matching between the metal nitride layer 5 and the layer 6 of $Al_zGa_{1-z}N$.

In a second embodiment, the composition of the metal nitride layer 5 is selected such that the lattice constant of the metal nitride layer 5 becomes smaller than the lattice constant of the subsequently deposited layer 6 of $Al_zGa_{1-z}N$. This can be achieved by a higher Al content of the metal nitride layer 5 compared to the layer 6 of $Al_zGa_{1-z}N$. In addition, the metal nitride layer 5 has to be at least partly or preferably fully relaxed. In this case, the subsequent layer 6 of $Al_zGa_{1-z}N$ grows on the surface of the metal nitride layer 5 under compressive strain. This reduces the warp of the wafer which occurs when it is cooled down to room temperature after deposition of the layer 6 of $Al_zGa_{1-z}N$ due to the high coefficient of thermal expansion of the latter layer.

In subsequent step f), the monocrystalline layer 6 consisting of $Al_zGa_{1-z}N$ ($0 \leq z \leq 1$) having a (0001) surface orientation is epitaxially deposited on top of the layer 4 of ScN or on top of the metal nitride layer 5 in case step e) had been performed. The total layer thickness can be up to 10 μm. This layer may consist of several (1 to 20) sub-layers having different compositions with the fraction z of Al ranging from 0 to 1. The sub-layer thickness may vary from 1 to 1000 nm.

An MOCVD or MBE system is used to deposit layer 6 of $Al_zGa_{1-z}N$. The substrate sample is heated up to $Al_zGa_{1-z}N$ deposition temperature ranging from 1000 to 1150° C. In case of MOCVD, a pre-flow of metal organics from 5 seconds to 2 minutes is preferable to wet the previously deposited layer. Growth temperature, reactor pressure ($3 \times 10^3$-$4 \times 10^4$ Pa), and gas flows may vary from one sub-layer to another depending upon the Al content in the layer.

In a particularly preferred embodiment of the present invention, the layer 6 of $Al_zGa_{1-z}N$ is a layer of GaN (i.e. z=0). In this case, it is preferable to omit step e) and to deposit the GaN directly on the surface of the layer 4 of ScN as the in-plane lattice constants of GaN and ScN are perfectly matched.

On top of the layer 6 of $Al_zGa_{1-z}N$ further layers can be deposited which are required for the function of the electronic or optoelectronic devices to be produced on the semiconductor wafer.

The present invention addresses the lattice mismatch issue with a multilayer structure by systematically reducing the misfit step by step from one layer to next. Insertion of ScN, whose lattice constant is very close to that of GaN, between $Sc_2O_3$ and GaN helps to reduce lattice misfit between the oxide buffer and the GaN layer. A top layer of GaN (or in general of $Al_zGa_{1-z}N$) of high crystal quality and low defect density can be deposited.

Example

In step a), a polished monocrystalline silicon substrate wafer with a (111) surface and a diameter of 100 mm is prepared. The wafer is cleaned with an aqueous buffered ammonium fluoride ($NH_4F$) solution. The substrate wafer is put into an MBE system where the rest of the process is performed. The wafer is first degassed in the loadlock of the MBE system for 20 minutes at a temperature of 200° C. and then transferred into the process chamber, where it is annealed for ten minutes in ultra-high vacuum at a temperature of 700° C.

In step b), a 20 nm thick layer of monocrystalline $Y_2O_3$ (111) is deposited on one surface of the substrate wafer. A standard MBE source is used. The deposition takes place at a temperature of 600° C. and a rate of 1 nm/min.

In step c), a 20 nm thick layer of monocrystalline $Sc_2O_3$ (111) is deposited on the surface of the layer of $Y_2O_3$. The deposition takes place at a temperature of 500° C. and a rate of 1 nm/min.

In step d), a 200 nm thick layer of single crystalline ScN (111) is grown in rock salt crystal structure on the surface of the layer of $Sc_2O_3$(111) by evaporation of scandium in a nitrogen plasma. The substrate temperature is fixed at 600° C. The temperature of the scandium effusion cell is 1400° C.

Figure 2:
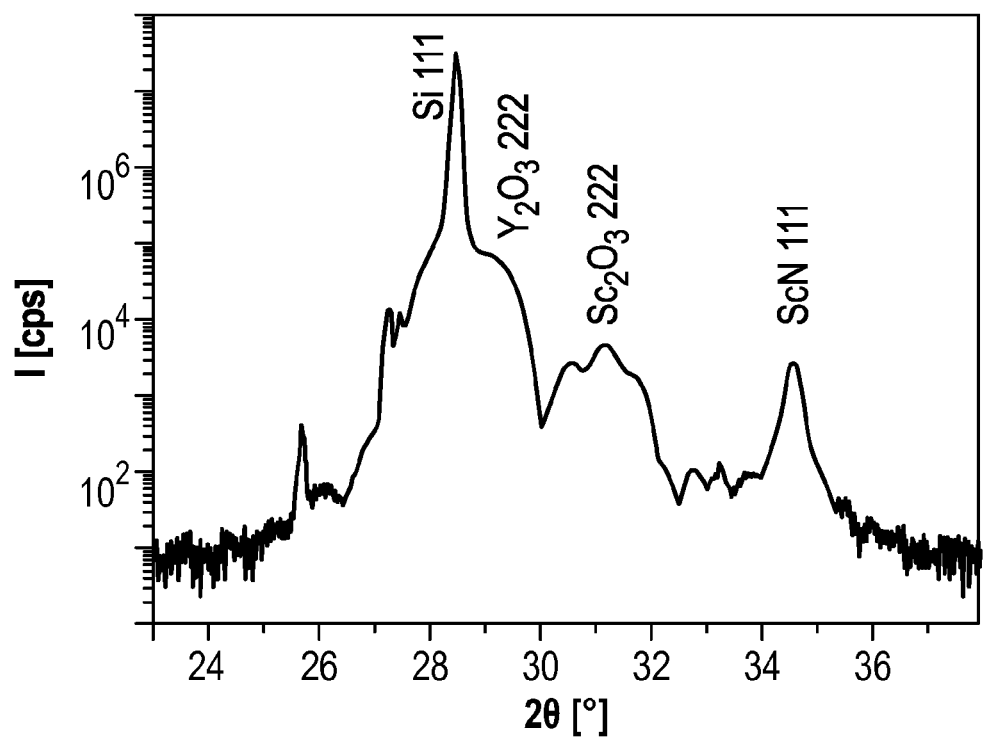
FIG. 2 shows the result of a specular theta/2theta XRD measurement demonstrating the growth of (111) oriented ScN in rock-salt structure on a $Sc_2O_3(111)/Y_2O_3(111)/Si$ (111) heterostructure.
Figure 3:
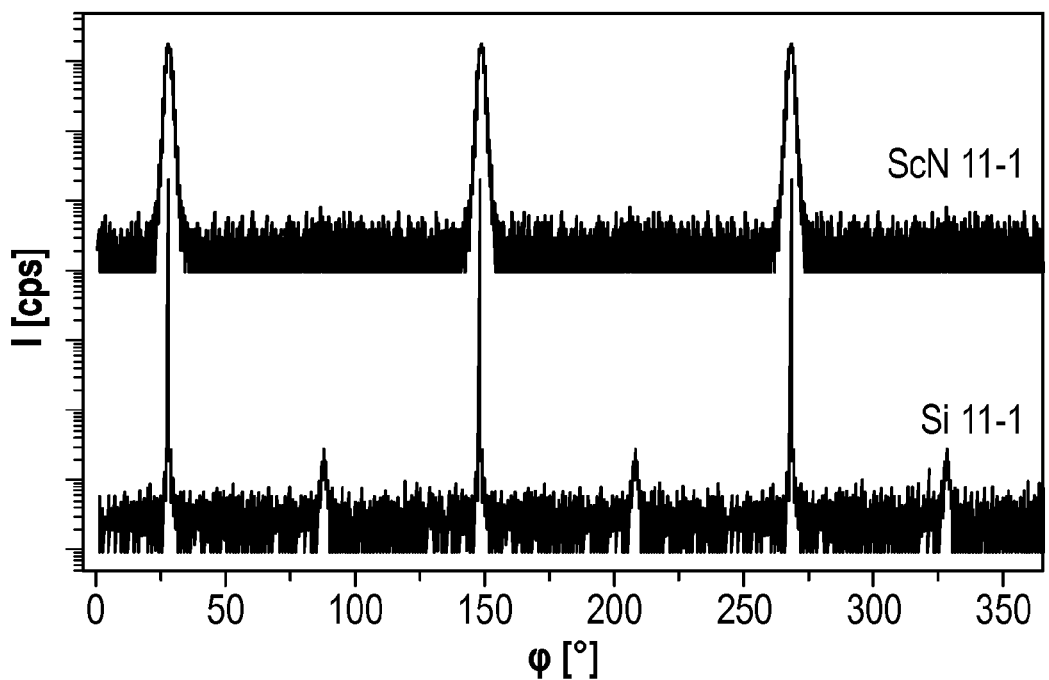
FIG. 3 shows the result of an XRD phi-scan over a family of {111} Si and ScN lattice planes demonstrating the twin-free growth of ScN(111).

The ScN layer is characterized by X-ray diffraction (XRD). FIGS. 2 and 3 show the intensity I (in counts per second, cps) as a function of the respective angle. FIG. 2 shows the result of a specular theta/2theta measurement. It demonstrates that the ScN layer has (111) surface orientations. No other orientations of ScN are detected. However, there is still the possibility of twinning due to the cubic stacking order variations of fcc-like rock salt ScN films in (111) orientation on $Sc_2O_3$(111) surfaces.

Such twinned layers are highly defective and need to be avoided. The phi-scan over a family of {111} Si and ScN lattice planes shown in FIG. 3 demonstrates that twinning is completely suppressed and truly single crystalline ScN(111) is thus obtainable.

In a last step f), a 500 nm thick layer of monocrystalline GaN(0001) is deposited on the surface of the layer of ScN. GaN is grown in the N-rich regime with a substrate temperature of 720° C., a Ga beam equivalent pressure (BEP) of $2 \times 10^{-5}$ Pa, a nitrogen flow of 0.4 sccm (standard cubic centimeters per minute) and a power of 300 W of the radio frequency plasma source. A smooth monocrystalline layer of GaN is obtained.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A semiconductor wafer comprising the following layers in the given order:
   a) a monocrystalline substrate wafer consisting essentially of silicon and having a (111) surface orientation,
   c) a monocrystalline layer of $Sc_2O_3$ having a (111) surface orientation,
   d) a monocrystalline layer of ScN having a (111) surface orientation, and f) a monocrystalline layer of $Al_zGa_{1-z}N$ with $0 \leq z \leq 1$ having a (0001) surface orientation.

2. The semiconductor wafer of claim 1, further comprising b), a monocrystalline metal oxide layer between the substrate wafer and the layer of $Sc_2O_3$.

3. The semiconductor wafer of claim 2, wherein the metal oxide layer has a cubic Ia-3 crystal structure and a composition of $(M^1_wM^2_{1-w})_2O_3$ with $0 \leq w \leq 1$, wherein $M^1$ is a first metal and $M^2$ is a second metal, wherein the metal oxide layer is located between the substrate wafer and the layer of $Sc_2O_3$, and wherein $M^1$, $M^2$ and w are selected such that the lattice constant of the metal oxide layer is equal to or smaller than the lattice constant of the substrate wafer and equal to or larger than the lattice constant of the layer of $Sc_2O_3$.

4. The semiconductor wafer of claim 3, wherein the layer of ScN has a thickness of 2 to 500 nm.

5. The semiconductor wafer of claim 1, wherein the layer of $Sc_2O_3$ has a thickness of 2 to 500 nm.

6. The semiconductor wafer of claim 2, wherein the layer of $Sc_2O_3$ has a thickness of 2 to 500 nm.

7. The semiconductor wafer of claim 1, wherein the layer of ScN has a thickness of 2 to 500 nm.

8. The semiconductor wafer of claim 2, wherein the layer of ScN has a thickness of 2 to 500 nm.

9. The semiconductor wafer of claim 1, further comprising e), a monocrystalline metal nitride layer having a composition of $(Al_xGa_{1-x})_ySc_{1-y}N$ with $0 \leq x \leq 1$ and $0 < y < 1$, the metal nitride layer being located between the layer of ScN and the layer of $Al_zGa_{1-z}N$.

10. The semiconductor wafer of claim 2, further comprising e), a monocrystalline metal nitride layer having a composition of $(Al_xGa_{1-x})_ySc_{1-y}N$ with $0 \leq x \leq 1$ and $0 < y < 1$, the metal nitride layer being located between the layer of ScN and the layer of $Al_zGa_{1-z}N$.

11. The semiconductor wafer of claim 1, wherein z=0.

12. A process for the production of a semiconductor wafer of claim 1, comprising the following steps in the given order:
a) providing a substrate wafer,
c) epitaxially depositing a layer of $Sc_2O_3$,
d) producing a layer of ScN, and
f) epitaxially depositing a layer of $Al_zGa_{1-z}N$.

13. The process of claim 12, wherein a monocrystalline metal oxide layer is epitaxially deposited in an additional step b) after step a) and prior to step c).

14. The process of claim 13, wherein step c) is performed by means of CVD, MBE, PLD or sputtering techniques.

15. The process of claim 12, wherein step c) is performed by means of CVD, MBE, PLD or sputtering techniques.

16. The process of claim 12, wherein in step d) the layer of ScN is produced by converting a surface of the $Sc_2O_3$ layer into ScN by exposing the surface to an atmosphere comprising a nitrogen source at a temperature of 200 to 1200° C.

17. The process of claim 12, wherein in step d) the layer of ScN is produced by depositing a layer of Sc on the surface of the layer of $Sc_2O_3$ and subsequently exposing the surface of the layer of Sc to an atmosphere comprising a nitrogen source at a temperature of 200 to 1200° C. and thus converting the layer of Sc into a layer of ScN.

18. The process of claim 12, wherein in step d) the layer of ScN is produced by epitaxially depositing the layer of ScN on the surface of the layer of $Sc_2O_3$.

19. The process of claim 12, wherein in a step e), a monocrystalline metal nitride layer having a composition of $(Al_xGa_{1-x})_ySc_{1-y}N$ with $0 \leq x \leq 1$ and $0 < y < 1$ is epitaxially deposited after step d) and prior to step f).

20. The process of claim 12, wherein step f) is performed by means of MOCVD or MBE.

* * * * *